United States Patent [19]

Lee et al.

[11] Patent Number: 5,543,738
[45] Date of Patent: Aug. 6, 1996

[54] MULTI-STAGE SENSE AMPLIFIER FOR READ-ONLY MEMORY HAVING CURRENT COMPARATORS

[75] Inventors: Fong-Chun Lee; Chien-Chih Fu; Nan-Chueh Wang, all of Hsinchu Hsien, Taiwan

[73] Assignee: United Microelectronics Corp., Hsinchu, Taiwan

[21] Appl. No.: 364,651

[22] Filed: Dec. 27, 1994

[51] Int. Cl.$^6$ ............................ G01R 19/00; H03K 5/153
[52] U.S. Cl. ................................. 327/51; 327/75; 327/74
[58] Field of Search ................................. 365/168, 205; 327/51–57, 74, 75, 76

[56] References Cited

U.S. PATENT DOCUMENTS

| | | | |
|---|---|---|---|
| 4,287,570 | 9/1981 | Stark | 365/168 |
| 4,653,023 | 3/1987 | Suzuki et al. | 365/168 |
| 5,012,448 | 4/1991 | Matsuoka et al. | 365/168 |
| 5,043,940 | 8/1991 | Harari | 365/168 |
| 5,163,021 | 11/1992 | Mehrotra et al. | 365/168 |

FOREIGN PATENT DOCUMENTS

| | | | |
|---|---|---|---|
| 59-0151395 | 8/1984 | Japan | 365/168 |

*Primary Examiner*—Toan Tran
*Attorney, Agent, or Firm*—Ladas & Parry

[57] ABSTRACT

A multi-stage sense amplifier for read-only memory having a memory array consisting of a large number of memory cell units. The sense amplifier includes a sense amplifier for sensing the currents flowing through the transistor of the memory cell units of the read-only memory. The memory cell unit transistors are programmed with one of four current capacity characteristics. The sense amplifier also includes three current comparators coupled to the sense amplifier, with each of the comparators having a current comparing unit for comparing the sensed current flowing through the memory cell unit transistors to the current flowing through the comparators. An output of each of the three comparators is provided for identifying whether or not the current of a four capacity characteristics flowing through the memory cell unit transistors is larger than the current flowing through the comparator. Each of the outputs of the comparators is combined to represent the data stored in each of the memory cell units of the read-only memory having two bits per memory cell unit.

6 Claims, 2 Drawing Sheets

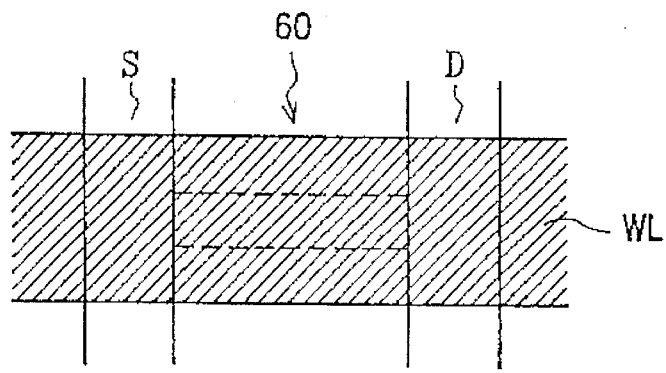
FIG. 1
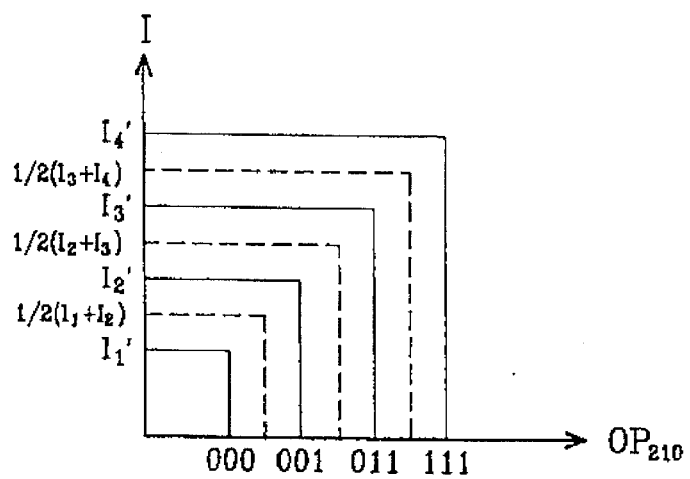
FIG. 3
| $OP_2$ | $OP_1$ | $OP_0$ | $\overline{O_1}$ | $\overline{O_0}$ | $O_1$ | $O_0$ |
|---|---|---|---|---|---|---|
| 0 | 0 | 0 | 0 | 0 | 1 | 1 |
| 0 | 0 | 1 | 1 | 0 | 0 | 1 |
| 0 | 1 | 1 | 1 | 1 | 0 | 0 |
| 1 | 1 | 1 | 0 | 1 | 1 | 0 |
$O_1 = \overline{OP_0 \oplus OP_2}$
$O_0 = \overline{OP_1}$
FIG. 4

MULTI-STAGE SENSE AMPLIFIER FOR READ-ONLY MEMORY HAVING CURRENT COMPARATORS

BACKGROUND OF THE INVENTION

1. Field of the Invention

The present invention relates in general to sense amplifiers for semiconductor read-only memories (ROMs). In particular, the present invention relates to a multi-stage sense amplifier for ROM devices capable of storing more than one bit of data in one single memory cell unit.

2. Technical Background

ROM's are widely used semiconductor integrated circuit (IC) memory storage devices for digital electronic equipment, and, in particular, microprocessor-based computer systems. Conventional digital circuitry in ROM's employ sense amplifiers to sense the content of an addressed memory cell in order to "read" a memory location.

State-of-the-art semiconductor ROM IC devices, however, store a single binary bit of information in each of their memory cell units. That is to say, the sensed result with respect to each memory cell unit of the ROM device is identified between two electrical potential stages. In other words, the memory content of a ROM memory cell as read is either a logical 1 or a logical 0.

Enlargement of the memory storage capacity (by increasing the number of memory cells), as well as reducing the physical size of the semiconductor device, have been targets which the semiconductor memory industry has been pursuing. Enlarged memory capacity and reduced memory semiconductor die size represent increased functionality and reduced cost, both of which are positive factors in the merchandising of semiconductor memory products. The greatest effort in the art has been concerned with the reduction of the device dimensions in order to squeeze more memory cell units in the same semiconductor die area. This approach, however, is limited by the current state of the art in resolving details during semiconductor processing.

SUMMARY OF THE INVENTION

The present invention allows for a reduction in size of ROM device by allowing more than one bit of information to be stored in a given memory cell. A multi-stage sense amplifier is disclosed for use with read-only memory having a memory array consisting of a large number of memory cell units. The sense amplifier senses currents flowing through a transistor in the memory cell units of the read-only memory. The memory cell unit transistors are programmed with one of four current capacity characteristics. The sense amplifier also comprises three current comparators coupled to the sense amplifier, with each of the comparators having a current comparing unit for comparing the sensed current flowing through the memory cell unit transistors to the current flowing through the comparators. An output of each of the three comparators is provided for identifying whether or not the current of a four capacity characteristics flowing through the memory cell unit transistors is larger than the current flowing through the comparator. Each of the outputs of the comparators is combined to represent the data stored in each of the memory cell units of the read-only memory having two bits per memory cell unit.

BRIEF DESCRIPTION OF THE DRAWING

Other objects,, features and advantages of the present invention will become apparent by way of the following detailed description of the preferred but non-limiting embodiment. The description is made with reference to the accompanied drawings, wherein:

FIG. 1 schematically shows the top view of the layout of a single memory cell unit in the semiconductor integrated circuit device in accordance with a preferred embodiment of the present invention.

FIG. 3 shows the output characteristics of the multistage sense amplifier of FIG. 2 sensing memory cell units with different storage contents characteristics; and FIG. 4 shows a truth table of decoder electronic circuitry for the memory device in accordance with the preferred embodiment of the present invention.

DETAILED DESCRIPTION OF THE PREFERRED EMBODIMENT

Figure 2:
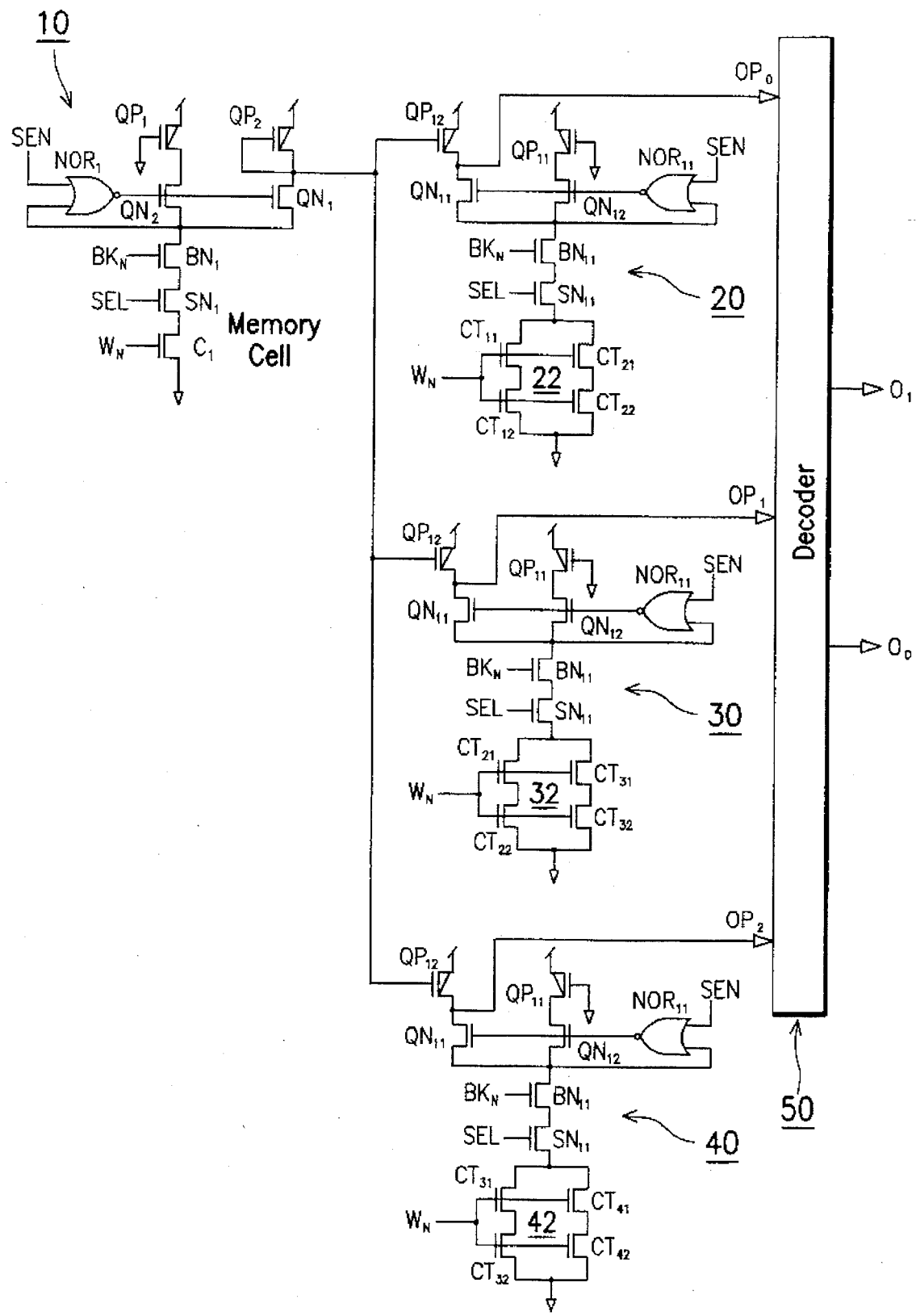
FIG. 2 is a schematic diagram showing a multi-stage sense amplifier in accordance with a preferred embodiment of the present invention.

The basic underlying concept of the present invention is outlined in FIG. 1, which schematically depicts a top view of the layout of a single memory cell unit in a semiconductor integrated circuit device according to a preferred embodiment of the present invention. In this figure, a polysilicon word line WL in the memory array in the ROM IC device overlies both source S and drain D regions of the memory device. A channel region 60 of the memory cell unit is formed underneath the coverage of the word line WL between source S and drain D regions.

In a conventional semiconductor ROM IC device, channel region 60 is selectively implanted with ions depending on whether the memory cell unit contains a logical zero or a logical one.

In accordance with the present invention, channel region 60 for each memory cell unit in the memory array of the ROM device is divided into three generally equal-width portions, as is identified in the FIG. 1 by the two broken lines depicted in channel region 60. During that phase of ROM device manufacturing when digital information is programmed into the ROM device, the entire channel region 60 of each memory cell unit can be subjected to an ion implantation procedure which results in four possible outcomes:

(1) No ions are implanted in any portion of channel region 60. When turned on, the current which flows is equal to $I_1$.

(2) One-third of the width of the channel region 60 is subjected to ion implantation. When turned on, the current which flows is equal to $I_2$.

(3) Two-thirds of the width of the channel region 60 is subjected to ion implantation. When turned on, the current which flows is equal to $I_3$.

(4) The entire width of the channel region is subjected to ion implantation. When turned on, the current which flows is equal to $I_4$.

With this arrangement, each cell of the ROM device has four possible states which can be detected by a multi-stage sense amplifier which will be described later. During reading operations the sensed voltage on the word line WL will exhibit one of four possible voltage values depending on whether zero, one, two or three portions of the entire channel region width were exposed during programming by the ion implantation procedure. With the help of suitable decoder circuitry, the four voltage values can each be identified as one of four digital values, for example, 00, 01, 10 and 11 when expressed in two-bit binary format. Thus the output of the retrieved information from a single memory cell comprises two bits of stored information or data.

Thus, as described above, the basic underlying principle of the present invention is to employ one memory cell to store two bits of information, rather than one bit of information as done in prior art ROM IC devices. This results in a two-fold memory capacity increase for the exemplified ROM IC device when the memory cell unit dimension remain equal.

FIG. 2 is a schematic diagram of the multi-stage sense amplifier, mentioned above, in accordance with a preferred embodiment of the present invention. As can be observed in this figure, the multi-stage sense amplifier comprises a sense amplifier 10 and three comparators 20, 30 and 40. A description of each of these primary constituent parts follows. Notice should be taken that the memory cell unit of the memory array selected to be read is symbolized in the schematic diagram of FIG. 2 as a memory cell unit transistor $C_1$. As is familiar to persons skilled in this art, each memory cell unit is represented by a transistor device in a schematic diagram. The circuitry for selecting a particular transistor to be read is well known in the art and therefore is not described in detail herein.

First, reference is made to sense amplifier 10. As is seen in FIG. 2, the sense amplifier 10 is utilized for the sensing the electrical potential across the memory cell unit $C_1$ when read. Sense amplifier 10 includes two PMOS transistors $QP_1$ and $QP_2$, two NMOS transistors $QN_1$ and $QN_2$, an NMOS block transistor $BN_1$, an NMOS select transistor $SN_1$, and a NOR gate $NOR_1$.

The gate of PMOS transistor $QP_1$ is tied to ground, its source is tied to the system power source voltage $V_{cc}$, and its drain connected to the drain of NMOS transistor $QN_2$. PMOS transistor $QP_2$ has its source tied to $V_{cc}$, and its drain and gate are tied together and are connected to the drain of NMOS transistor $QN_2$. Gates of NMOS transistors $QN_1$ and $QN_2$ are both strobed by a sense enable signal SEN of the ROM device indirectly through NOR gate $NOR_1$.

The sense enable signal SEN is utilized to preserve device power consumption of the entire ROM IC device when it is not being accessed. The sources of NMOS transistors $QN_2$ and $QN_2$ are tied together and connected to the drain of NMOS block transistor $BN_1$. The source of NMOS block transistor $BN_1$ is connected to the drain of NMOS select transistor $SN_1$, which, in turn has its source connected to the drain of memory cell unit transistor $C_1$. Transistor $C_1$, on the other hand has its source tied to ground. The gate of the NMOS block transistor $BN_1$ is strobed by a block signal BKN, and the gate of NMOS select transistor $SN_1$ is strobed by a select signal SEL. With the application of the block signal BKN that drives NMOS block transistor $BN_1$, the memory electronics can be divided into sections that are convenient for the conservation of power consumption.

Next, referring to comparators 20, 30 and 40, they share a similar circuitry configuration which is similar to that of the sense amplifier 10, as can be seen in FIG. 2. The only difference is that the comparators 20, 30 and 40 each has a current comparing unit 22, 32 and 42 respectively in place of the memory cell unit transistor $C_1$ in the sense amplifier 10.

Other than two above, the comparators 20, 30 and 40 each comprise two PMOS transistors $QP_{11}$ and $QP_{12}$, two NMOS transistors $QN_{11}$ and $QN_{22}$, an NMOS block transistor $BN_{11}$, an NMOS select transistor $SN_{11}$, a NOR gate $NOR_{11}$, and the current comparing units 22, 32 and 42 respectively. It should be pointed out that the same reference characters, but with differing subscripts, are used in the three independent comparators for the purpose of simplicity of description of the present invention. The use of the same characters for these various transistors suggests that they are not only comparably identical transistors, but that their structural dimensions are also the same. In other words, the dimension of PMOS transistors $QP_{11}$ and $QP_{12}$ are the same as that of $QP_1$ and $QP_2$ respectively. Likewise, in terms of structural dimensions, transistors $QN_{11}$ and $QN_{12}$ are the same as that of $QN_1$ and $QN_2$ respectively, while $BN_{11}$ is the same as $BN_1$, and $SN_{11}$ is the same as $SN_1$.

The three comparators 20, 30 and 40 each has a current comparing unit 22, 32 and 42 respectively. Each current comparing unit has a similar structural configuration of two pairs of two serially connected NMOS transistors connected in parallel, as shown in the figure. Each pair of NMOS transistors connected in series have the same physical dimensions, but each pair is different in dimension compared to the other pair of transistors connected in parallel therewith. For example, in current comparing unit 22, NMOS transistors $CT_{11}$ and $CT_{12}$ have the same physical dimensions, and $CT_{21}$ and $CT_{22}$ have the same physical dimensions, but the latter pair have different dimensions compared to that of the first-mentioned pair. NMOS transistors $CT_{21}$ and $CT_{22}$ also appear in comparator 30. That means that those transistors in comparator 30 have the same size as the similarly identified transistors in comparator 20.

There is a similar arrangement in current comparing units 32 and 42 with respect to NMOS transistors $CT_{31}$, $CT_{32}$. Thus, a total of four different sizes of series-connected transistor pairs $CT_{11},CT_{12}$; $CT_{21},CT_{22}$; $CT_{31},CT_{32}$ and $CT_{41},CT_{42}$ are employed in the three current comparing units 22, 32 and 42. Thus current comparing units 22 and 32 have similar transistor pairs $CT_{21}/CT_{22}$ in one of their two parallel shunt branches, and, on the other hand, the current comparing units 32 and 42 have the similar transistor pairs $CT_{31}/CT_{32}$ in one of their two parallel shunt branches.

This arrangement of the NMOS transistor physical dimensions provides four transistor types which correspond respectively to the four possible levels of ion implantation in the channel regions of the memory cell unit transistors in the memory array of the ROM device, as described above with reference to FIG. 1.

All the twelve NMOS transistors in the three current comparing units are gated or strobed by a common word line signal $W_N$. The currents flow through the NMOS transistors. $CT_{11}$, $CT_{21}$, $CT_{31}$ and $CT_{41}$, when the current comparing units are gated on, are $I_1$, $I_2$, $I_3$ and $I_4$, respectively. As previously mentioned, the currents flowing through each of the memory cell unit transistors $C_1$ of the ROM device, which have the four possible levels of ion implantation, are also either $I_1$, $I_2$, $I_3$ or $I_4$ (respectively corresponding to zero, one, two or three of the one-third width channel regions being exposed to ion implantation during device programming phase). Then, the current flowing through the current comparing units 22, 32 and 42 will be $\frac{1}{2}(I_1+I_2)$, $\frac{1}{2}(I_2+I_3)$ and $\frac{1}{2}(I_3+I_4)$ respectively.

Referring again to FIG. 2, three output ports $OP_0$, $OP_1$ and $OP_2$ are tapped at the drains of the PMOS transistors $QP_{12}$ of the current comparing units 20, 30 and 40 respectively. The signal on any of output ports $OP_0$, $OP_1$ and $OP_2$ will be a high level, i.e. a logical 1, whenever the corresponding current flowing through the corresponding current comparing unit 20, 30 or 40 is exceeded by the current flowing through the memory cell unit transistor $C_1$ then connected to the current sense amplifier 10. Otherwise, the signal on an output port will be low, or logical 0.

FIG. 3 of the drawing shows the output characteristics of the multi-stage sense amplifier of FIG. 2 sensing memory cell units with different storage contents characteristics. The abscissa of the axis of the plot represents the output ports $OP_0$, $OP_1$ and $OP_2$ generally designated as $OP_{210}$ in the drawing. The ordinates of the axis, on the other hand, represents the current.

It should be pointed out that the currents $I_1$, $I_2$, $I_3$ and $I_4$ are arranged so as to satisfy the condition that $I_1 < I_2 < I_3 < I_4$, as is reflected in FIG. 3. To satisfy this condition, the physical dimensions of the transistors, as well as the channel region width are adjusted accordingly, as persons skilled in this art can appreciate.

Assume, for example, the current flowing through the memory cell unit transistor $C_1$ is $I_1$, with its channel region having no portion thereof programmed by ion implantation. This implies a physical dimension of the memory cell unit transistor $C_1$ virtually equal to that of the transistors $CT_{11}$ and $CT_{12}$ in current comparing unit 20. As is seen in FIG. 3, the current $I_1$ is the smallest in the shown scales, which indicates the fact that it is smaller than the currents flowing in any of the current comparing units 20, 30 and 40. Therefore, the output voltages, or their equivalent logical levels, as measured at output ports $OP_0$, $OP_1$ and $OP_2$ (generally designated as $OP_{210}$ in FIG. 3), will be 0, 0 and 0, as represented on the abscissa by the 000.

As another example, assume the current flowing in the memory cell unit transistor $C_1$, is $I_3$, which occurs when two-thirds of the channel width of transistor $C_1$ was programmed by ion implantation, then the logical levels as measured at output ports $OP_0$, $OP_1$ and $OP_2$ will be 0, 1 and 1, as represented in the abscissa by a 011.

At the output ports $OP_0$, $OP_1$ and $OP_2$ of the sense amplifier as shown in FIG. 2, a suitable decoder 50 can be readily provided to decode the three-bit sensed logical values into two-bit data for output as the memory cell unit transistors $C_1$ are being read. FIG. 4 of the drawing sets forth a truth table for such a decoder. The implementation of the decoder is straight forward. In FIG. 4, the logical values of the output ports $OP_0$, $OP_1$ and $OP_2$ are converted into two data bits $O_1$ and $O_0$, with the decoding expression listed therein. Persons skilled in this art can appreciate the fact that other similar electronic logics means can be employed as well to serve the decoding requirements equally well.

Thus, in accordance with the disclosure of the present invention, a single memory cell unit in a memory array of a ROM IC device can be utilized to store two bits of data, rather than only one bit as is done in the prior art. A programming scheme has been disclosed in relation to channel region width management for the memory cell unit transistors, as well as for transistors in the multi-stage sense amplifier. These features facilitate better utilization of a single memory cell. It should, however, be pointed out that the above described embodiments of the memory cell unit and multi-stage sense amplifier, as well as the decoding means, are only for the purpose of the description clarity of the present invention and not for limiting the scope of the invention. Having disclosed the invention in connection with a preferred embodiment thereof, modification will now suggest itself to those skilled in the art. For example, with suitable adjustment in the memory cell unit channel region width, as well as the provision of the matching sense amplifier and decoder means, the single memory cell can be arranged to store more than two bits of data (for example three or more bits of data), as persons in the art will appreciate after reading the above description of the present invention.

We claim:

1. A multi-stage sense amplifier for read-only memory having a memory array consisting of a plurality of memory cell units, said multi-stage sense amplifier comprising:

a sense amplifier for sensing the current flowing through a transistor of said memory cell units of said read-only memory, said memory cell unit transistor being programmed with one of four memory cell unit current capacity characteristics;

three current comparators coupled to said sense amplifier, each of said comparators having a current comparing unit for comparing a sensed current flowing through said memory cell unit transistor a current flowing through each of said comparators;

wherein an output of each of said three comparators is provides for identifying whether or not the current flowing through said memory cell unit transistor is larger than said currents flowing through said comparators, and each of said outputs of each of said comparators representing multibit data stored in each of said memory cell units of said read-only memory;

wherein said three current comparators each includes a current comparing unit having comparison unit transistors selected from four possible transistor characteristics, said four possible transistor characteristics having four predefined current capacity characteristics that are respectively and virtually equal to said four memory cell unit current capacity characteristics; and wherein each of said three current comparing units includes four types of comparison unit transistors, with every two of said four comparison unit transistors connected in series, and the two pairs of series comparison unit transistors connected in parallel, said every two comparison unit transistors connected in series having the same physical dimensions providing the same predefined current capacity characteristics, while the comparison unit transistors not in the same series connection having different physical dimensions providing different predefined current capacity characteristics.

2. The multi-stage sense amplifier for read-only memory of claim 1, wherein each of said current comparators compares the current flowing therein to said current flowing through said memory cell unit transistor sensed by said sense amplifier, each of said current comparators outputs a logical one when said current of said memory cell unit transistor is greater than the current flowing therethrough said comparator, and a logical zero when the comparison result is smaller.

3. The multi-stage sense amplifier for read-only memory of claim 2, wherein said predefined current capacity characteristics are determined by the physical dimensions of said transistors.

4. The multi-stage sense amplifier for read-only memory of claim 3, wherein said memory cell unit current capacity characteristics are determined by the channel region width of said memory cell unit transistor.

5. The multi-stage sense amplifier for read-only memory of claim 4, wherein said memory cell unit current capacity characteristics are determined by ion implantation into the channel region of said memory cell transistor into selected none, one-third, two-thirds, or entire channel width for presenting said four memory cell unit current capacity characteristics.

6. The multi-stage sense amplifier for read-only memory of claim 5, wherein a decoder means is connected to said three current comparators for decoding said outputs into one of four two-bit data including 00, 01, 10 and 11.

\* \* \* \* \*